US005998082A

United States Patent [19]

[11] Patent Number: 5,998,082
[45] Date of Patent: Dec. 7, 1999

Jimbo et al.

[54] THERMAL RECORDING MATERIAL

[75] Inventors: Yoshihiro Jimbo; Hiroshi Kawakami, both of Fujinomiya, Japan

[73] Assignee: Fuji Photo Film Co., Ltd., Kanagawa, Japan

[21] Appl. No.: 08/915,863

[22] Filed: Aug. 21, 1997

[30] Foreign Application Priority Data

Aug. 26, 1996 [JP] Japan .................................... 8-224252

[51] Int. Cl.$^6$ .............................. G03C 1/54; G03F 7/021

[52] U.S. Cl. .......................... 430/138; 430/151; 430/157; 430/171; 430/176

[58] Field of Search .................................... 430/138, 157, 430/171, 176, 151

[56] References Cited

U.S. PATENT DOCUMENTS

| | | | |
|---|---|---|---|
| 3,397,985 | 8/1968 | Hendrickx | 430/171 |
| 4,252,884 | 2/1981 | Bennett | 430/147 |
| 4,289,839 | 9/1981 | DiPippo | 430/177 |
| 4,576,892 | 3/1986 | Golda et al. | 430/157 |
| 4,590,143 | 5/1986 | Scheler | 430/171 |
| 4,965,166 | 10/1990 | Hosoi et al. | 430/157 |
| 4,980,260 | 12/1990 | Shinozaki et al. | 430/171 |
| 5,213,939 | 5/1993 | Sugiyama et al. | 430/171 |
| 5,459,011 | 10/1995 | Iida et al. | 430/171 |
| 5,679,494 | 10/1997 | Minami et al. | 430/157 |
| 5,683,850 | 11/1997 | Matushita et al. | 430/138 |

*Primary Examiner*—John S. Chu
*Attorney, Agent, or Firm*—Sughrue, Mion, Zinn, Macpeak & Seas, PLLC

[57] ABSTRACT

A thermal recording material comprising a support having provided thereon a thermal recording layer containing a diazonium salt and a coupling component. The diazonium salt is a compound represented by the following general formula (1):

General Formula (1)

General Formula (1)

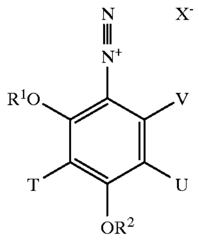

wherein T and U each independently represents a hydrogen atom, a halogen atom, an alkyl group or an acylamino group; V represents a hydrogen atom, a halogen atom, an alkyl group or $OR^3$; $R^1$, $R^2$ and $R^3$ each independently represents an alkyl group or an aryl group; and $X^-$ represents an anion. The thermal recording material has excellent stock storage stability and provides fast color-developed images having an extremely high developed color density.

9 Claims, No Drawings

THERMAL RECORDING MATERIAL

FIELD OF THE INVENTION

The present invention relates to thermal recording materials employing diazonium salts and coupling components as color developing components, and particularly to thermal recording materials having excellent raw stock storage stability and high developed color density in thermal recording.

BACKGROUND OF THE INVENTION

Diazonium salts are compounds having very high chemical activity, and react with phenol derivatives or compounds having active methylene groups, called coupling components, to readily form azo dyes. They are also photosensitive, and decompose by light irradiation to lose their activity. Diazonium compounds therefore have long been utilized as light recording materials represented by diazo copies (see *Shashin Kogaku no Kiso* (*Higinen Shashin*) [*The Fundamentals of Photographic Engineering* (*Nonsilver Photograph*)], pages 89 to 117 and 182 to 201 (1982), Corona Publishing Co. Ltd.).

Furthermore, by utilizing the property of light decomposition and the resulting loss of activity, recently, diazonium compounds have also been applied to recording materials which require image fixing. In this regard, light-fixing type thermal recording materials have been proposed in which the recording materials comprising recording layers containing diazonium salts and coupling components are heated in accordance with image signals to react the same and thereby form images. This is followed by light irradiation to fix the images (Koji Sato et al., *Gazo Denshi Gakkaishi,* 11(4), 290–296 (1982)).

However, in such recording materials using a diazonium salt as a color developing element, the diazonium salt has extremely high chemical activity. As a result, the diazonium salt gradually pyrolyzes even in the dark to lose its reactivity. Therefore, the above mentioned recording materials have a short shelf life.

Various methods have been proposed for reducing the instability of the diazonium compounds, and one of the most effective means is to encapsulate the diazonium salt. Such micro-encapsulation isolates the diazonium salt from decomposition enhancers such as water and basic compounds. Accordingly, decomposition of the diazonium salt is considerably inhibited and the shelf life of recording materials containing an encapsulated diazonium salt is also remarkably improved (Tomomasa Usami et al., *Denshi Shashin Gakkaishi,* 26(2), 115–125 (1987)).

In a general method of encapsulation, the diazonium salt is dissolved in a hydrophobic solvent (oily phase). The resulting solution is added to an aqueous solution of a water-soluble polymer (aqueous phase), followed by emulsifying and dispersing with a homogenizer or the like. A monomer or prepolymer for forming microcapsule walls is previously added to either the oily phase or the aqueous phase, or to both. This induces a polymerization reaction or deposits a polymer at the interface of the oily phase and the aqueous phase to form polymer walls and thereby prepare the microcapsules.

These methods are described in detail, for example, in Tomoshi Kondo, *Microcapsules*, Nikkan Kogyo Shinbunsha (1970), Tamotsu Kondo et al., *Microcapsules*, Sankyo Shuppan (1977).

The microcapsule walls thus formed may comprise various materials such as crosslinked gelatin, alginates, cellulose derivatives, urea resins, urethane resins, melamine resins and nylon resins.

When the microcapsules have walls formed of a material having a glass transition temperature that is a little higher than room temperature, such as urea resins and urethane resins, the capsule walls are mass non-permeable at room temperature but are mass permeable at the glass transition temperature or higher. Such microcapsules are called thermally responsive microcapsules and are useful for thermal recording materials.

That is, recording materials comprising a support having provided thereon a thermal recording layer containing: thermally responsive microcapsules containing a diazonium salt; a coupler; and a base allow for stable retention of the diazonium salt for a long period of time, easy formation of color-developed images by heating, and also image fixing by light irradiation.

As described above, micro-encapsulation of the diazonium salt makes it possible to far improve the stability of the thermal recording materials.

However, when the diazonium salt itself is chemically unstable, the improvement in stability is limited even if the diazonium salt is micro-encapsulated. For improving the stability of thermal recording materials, it is also important to improve the stability of the diazonium salt itself. In thermal recording materials using a conventional diazonium salt, the recording material is irradiated with light having an absorption wavelength for the diazonium salt after thermal printing. This causes photolysis or fixing of the diazonium salt such that the reactivity thereof with a coupling component is lost. Accordingly, storage of the thermal recording material in an illuminated room for a long period of time advances photolysis of the diazonium salt, which in turn tends to decrease the developed color density after storage. In view of the above, the present inventors have conducted extensive investigations relating to the photolysis of diazonium salts.

SUMMARY OF THE INVENTION

It is therefore an object of the present invention to provide a thermal recording material containing a diazonium salt which provides a sufficiently high color-developed image density and excellent raw stock storage stability.

Other objects and effects of the present invention will be apparent from the following description.

The above objects of the present invention have been attained by a thermal recording material comprising a support having thereon a thermal recording layer containing a diazonium salt and a coupling component, wherein said diazonium salt is a compound represented by the following general formula (1):

General Formula (1)

General Formula (1)

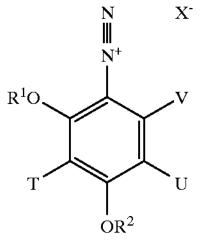

wherein T and U each independently represents a hydrogen atom, a halogen atom, an alkyl group or an acylamino group;

V represents a hydrogen atom, a halogen atom, an alkyl group or $OR^3$; $R^1$, $R^2$ and $R^3$ independently represents an alkyl group or an aryl group; and $X^-$ represents an anion.

Of the diazonium salts represented by the above-mentioned general formula (1), compounds represented by the following general formula (2) are particularly preferred.

General Formula (2)

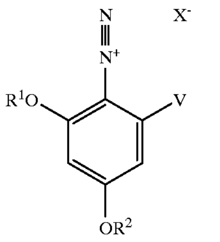

wherein V represents a hydrogen atom, a halogen atom, an alkyl group or $OR^3$; $R^1$, $R^2$ and $R^3$ each independently represents an alkyl group or an aryl group; and $X^-$represents an anion.

Furthermore, the diazonium salt is preferably microencapsulated.

The diazonium salt represented by general formula (1) or (2) has a maximum absorption wavelength shorter than 350 nm. Accordingly, fixing substantially does not occur when the recording material is illuminated with a light having a wavelength longer than 350 nm which is frequently used as a fixing light. Thus, the thermal recording material of the present invention allows for easy handling in an illuminated room.

In the present invention, the coupling component is preferably a compound represented by the following general formula (3):

General Formula (3)

$E^1—CH_2—E^2$ wherein $E^1$ and $E^2$ each independently represents an electron-withdrawing group.

DETAILED DESCRIPTION OF THE INVENTION

The present invention is described in detail below.

The diazonium salts represented by general formulae (1) or (2) are described in detail below.

In formulae (1) and (2), the halogen atoms represented by T, U and V are preferably fluorine, chlorine and bromine, and particularly preferably chlorine.

In the above formulae, the alkyl groups represented by T, U and V are preferably alkyl groups having a total carbon atom number of from 1 to 30, and examples thereof are preferably methyl, ethyl, n-propyl, isopropyl, n-butyl, tert-butyl, benzyl, α-methylbenzyl, chloroethyl, trichloromethyl and trifluoromethyl. Of these, methyl is particularly preferred.

In the above formulae, the acylamino groups represented by T and U are preferably acylamino groups having a total carbon atom number of from 2 to 30, and example thereof are preferably acetamido, propionylamino, pivaloylamino, chloroacetamido and benzoylamino.

The alkyl groups represented by $R^1$, $R^2$ and $R^3$ are preferably alkyl groups having a total carbon atom number of from 1 to 30, and examples thereof are preferably methyl, ethyl, propyl, butyl, hexyl, 2-ethylhexyl, octyl, decyl, dodecyl, benzyl, allyl, 2-chloroethyl, 2-methoxyethyl, 2-phenoxyethyl, 2-(4-methoxyphenoxy)ethyl, 2-benzoyloxyethyl, 2-cyanoethyl, ethoxycarbonylmethyl, butoxycarbonylmethyl, hexyloxycarbonylmethyl, octyloxycarbonylmethyl, 2-ethoxycarbonylethyl, N,N-dibutylcarbamoylmethyl and N,N-bis (2-ethylhexyl) carbamoylmethyl.

The aryl groups represented by $R^1$, $R^2$ and $R^3$ are preferably aryl groups having a total carbon atom number of from 6 to 30, and examples thereof are preferably phenyl, 4-acetamidophenyl and 4-chlorophenyl.

Furthermore, T, U, V, $R^1$ and $R^2$ each may be a substituent having a diazoniophenyl group as its substituent group, and may have a bis form or a higher polymer form.

Of the anions represented by $X^-$, inorganic anions preferably include hexafluorophosphoric acid ion, fluoroboric acid ion, chloride ion and sulfuric acid ion, and hexafluorophosphoric acid ion. Organic anions represented by $X^-$preferably include polyfluoroalkylcarboxylic acid ion, polyfluoroalkylsulfonic acid ion, a tetraphenylboric acid ion, aromatic carboxylic acid ion and aromatic sulfonic acid ion.

Specific examples of the diazonium salts for use in the present invention represented by general formulae (1) or (2) are shown below, but the present invention should not be construed as being limited thereto.

A-1

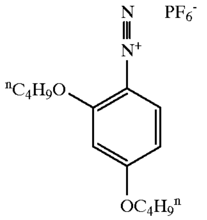

A-2

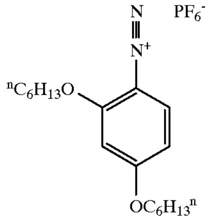

A-3

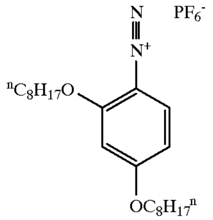

A-4

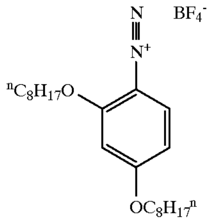

-continued
A-5
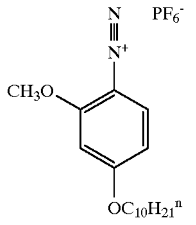
A-6
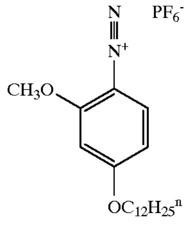
A-7
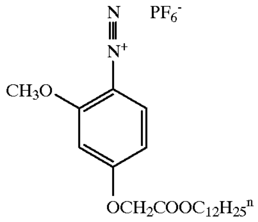
A-8
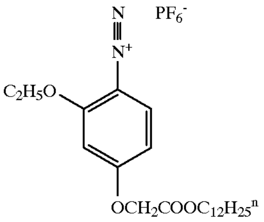
A-9
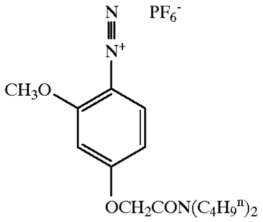
A-10
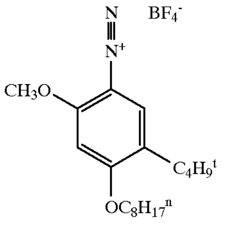
-continued
A-11
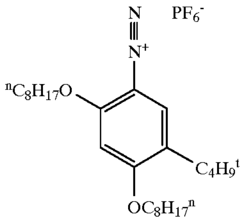
A-12
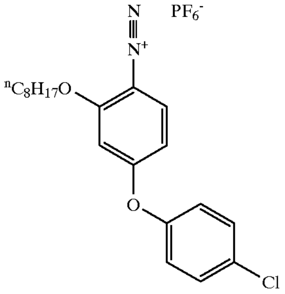
A-13
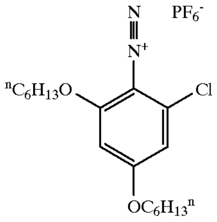
A-14
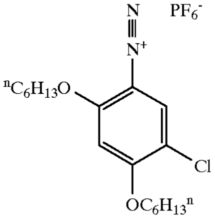
A-15
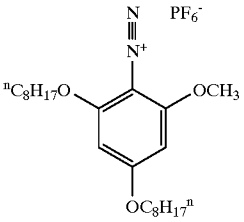
A-16
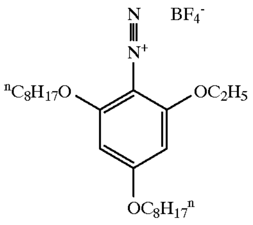

-continued

A-17

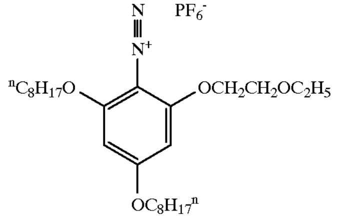

A-17

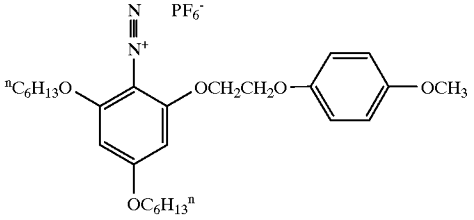

A-18

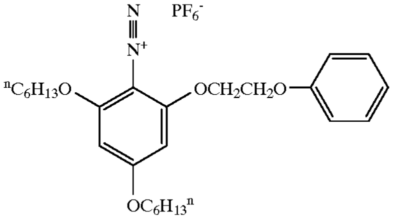

A-19

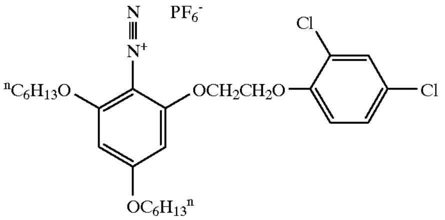

A-20

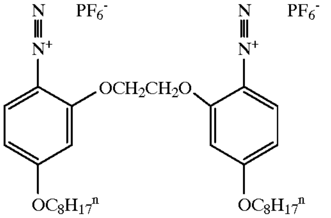

A-21

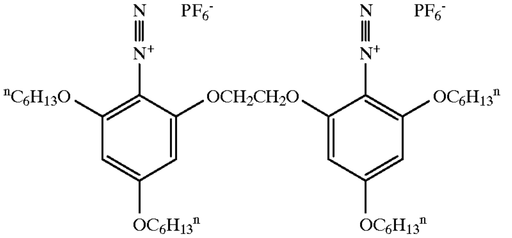

A-22

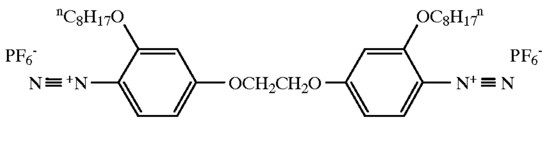

The diazonium salts represented by general formulae (1) or (2) can be produced by known methods. That is, they may be obtained by diazotizing the corresponding aniline compounds in an acidic solvent with sodium nitrite, nitrosylsulfuric acid, isoamyl nitrite or the like. For example, the synthesis of compound A-2 above is described below.

Synthesis of Compound A-2

A mixture of 36.9 g of 2', 4'-dihexyloxyacetanilide, 45.8 ml of concentrated sulfuric acid and 110 ml of methanol was heat refluxed for 3 hours, followed by cooling to −5° C. A solution of 8.3 g of sodium nitrite and 30 ml of water was added dropwise thereto, and the resulting mixture was stirred at 10° C. for 1 hour. To the reaction mixture, 26.3 g of potassium hexafluorophosphate and 250 ml of water were added, followed by stirring at 10° C. for 30 minutes. Precipitated crystals were collected by filtration, washed with isopropanol, recrystallized from ethyl acetate and isopropanol, and dried to obtain 38.7 g of exemplified compound A-2. The ultraviolet absorption spectrum in chloroform showed a maximum absorption wavelength $\lambda_{max}$ of 304 nm and a molecular extinction coefficient $\epsilon$ of $2.18\times10^4$.

The diazonium salts represented by general formulae (1) or (2) may either be oily products or have a crystalline state. However, they are preferably in a crystalline state at ordinary temperature to allow for ease in handling.

When the diazonium salt represented by general formulae (1) or (2) is emulsified, the compound may be dissolved in an appropriate high boiling solvent (for example, tricresyl phosphate or dioctyl phthalate) or in a low boiling auxilliary solvent (for example, ethyl acetate). Therefore, the diazonium salt preferably is appropriately soluble in these solvents. Specifically, the solubility of the diazonium salt in these solvents is preferably 5 wt % or more, and the solubility in water is preferably 1 wt % or less.

The compounds of general formulae (1) and (2) may be used alone or as a combination of two or more thereof.

The compounds of general formulae (1) and (2) are preferably used in an amount ranging from 0.02 to 5 g/$m^2$ in the thermal recording layer of the thermal recording material. However, from the viewpoint of developed color density, the addition amount thereof is preferably from 0.1 to 4 g/$m^2$.

In order to stabilize the diazonium salt for use in the present invention, complex compounds thereof together with zinc chloride, cadmium chloride, tin chloride or the like can be formed. Such a type of the diazonium salt may be used alone or as a combination of two or more thereof.

The coupling component for use in the present invention is not particularly limited, and includes those compounds which couple with the diazo compound under a basic condition to form a dye. In general, 4-equivalent couplers known in the field of silver halide photographic materials can be used as the coupling component of the present invention. The coupling component can also be selected depending on the desired hue.

Examples thereof include active methylene compounds having a methylene group next to a carbonyl group, phenol derivatives and naphthol derivatives. Specific examples thereof include the following compounds, which are used within a range which meets the objectives of the present invention.

Specific examples of the coupling component include resorcin, phloroglucin, sodium 2,3-dihydroxynaphthalene-6-sulfonate, sodium 2-hydroxy-3-naphthalenesulfonate, 2-hydroxy-3-naphthalene-sulfonic acid anilide, 1-hydroxy-2-naphthoic acid morpholinopropylamide, 2-hydroxy-3-naphthalenesulfonic acid morpholinopropylamide, 2-hydroxy-3-naphthalenesulfonic acid-2-ethylhexyloxypropylamide, 2-hydroxy-3-naphthalenesulfonic acid-2-ethylhexylamide, 5-acetamido-1-naphthol, sodium 1-hydroxy-8-acetamidonaphthalene-3,6-disulfonate, 1-hydroxy-8-acetamidonaphthalene-3 , 6-disulfonic acid dianilide, 1,5-dihydroxynaphthalene, 2,3-dihydroxynaphthalene, 2-hydroxy-3-naphthoic acid morpholinopropylamide, 2-hydroxy-3-naphthoic acid octylamide, 2-hydroxy-3-naphthoic acid anilide, 5,5-dimethyl-1,3-cyclohexanedione, 1,3-cyclopentanedione, 5-(2-n-tetradecyloxyphenyl)- 1,3-cyclohexanedione, 5-phenyl-4-methoxycarbonyl-1,3-cyclohexanedione, 5-(2, 5-di-n-octyloxy-phenyl)-1,3-cyclohexanedione, 1,3-dicyclohexylbarbituric acid, 1,3-di-n-dodecylbarbituric acid, 1-n-octyl-3-n-octadecylbarbituric acid, 1-phenyl-3-(2, 5-di-n-octyloxy-phenyl) barbituric acid, 1,3-bis (octadecyloxycarbonylmethyl)-barbituric acid, 1-phenyl-3-methyl-5-pyrazolone, 1-(2,4,6-trichlorophenyl) -3-anilino-5-pyrazolone, 1-(2,4,6-trichlorophenyl) -3-benzamido-5-pyrazolone, 6-hydroxy-4-methyl -3-cyano-1-(2-ethylhexyl)-2-pyridone, 2-[3-[α-(2,4-di-tert -amylphenoxy) butaneamido]benzamido]phenol, 2,4-bis (benzoylacetamino)toluene, 1,3-bis (pivaloylacetaminomethyl) benzene, benzoylacetonitrile, thenoylacetonitrile, acetoacetanilide, benzoylacetanilide, pivaloylacetanilide, 2-chloro-5-(N-n-butylsulfamoyl)-1-pivaloylacetamidobenzene, 1-(2-ethylhexyloxypropyl)-3-cyano-4-methyl-6-hydroxy-1,2-dihydropyridine-2-one, 1-(dodecyloxypropyl)-3-acetyl-4-methyl-6-hydroxy-1,2-dihydropyridine-2-one and 1-(4-n-octyloxyphenyl) -3-tert-butyl-5-aminopyrazole.

Details of the above couplers are described in JP-A-4-201483 (the term "JP-A" as used herein means an "unexamined published Japanese patent application"), JP-A-7-125446, JP-A-7-96671, JP-A-7-223367 and JP-A-7-223368.

The coupling components for use in the thermal recording material of the present invention are particularly preferably represented by general formula (3). The coupling components represented by general formula (3) are described in detail below.

In formula (3), the electron-withdrawing groups represented by $E^1$ and $E^2$, which may be the same or different, define substituent groups having positive Hammett σ values, and are preferably acyl groups such as acetyl, propionyl, pivaloyl, chloroacetyl, trifluoroacetyl, 1-methylcyclopropylcarbonyl, 1-ethylcyclopropylcarbonyl, 1-benzylcyclopropylcarbonyl, benzoyl, 4-methoxybenzoyl and thenoyl; oxycarbonyl groups such as methoxycarbonyl, ethoxycarbonyl, 2-methoxyethoxycarbonyl and 4-methoxyphenoxycarbonyl; carbamoyl groups such as carbamoyl, N,N-dimethylcarbamoyl, N,N-diethylcarbamoyl, N-phenylcarbamoyl, N-2,4-bis (pentyloxy)phenylcarbamoyl, N-2,4-bis (octyloxy) phenylcarbamoyl and morpholinocarbonyl; a cyano group; sulfonyl groups such as methanesulfonyl, benzenesulfonyl and toluenesulfonyl; phosphono groups such as diethylphosphono; and heterocyclic groups such as benzoxazole-2-yl, benzothiazole-2-yl, 3,4-dihydroquinazoline-4-one-2-yl and 3,4-dihydroquinazoline-4-sulfone-2-yl.

Furthermore, both the electron-withdrawing groups represented by $E^1$ and $E^2$ may combine to form a ring. The ring formed by $E^1$ and $E^2$ is preferably a 5- or 6-membered carbocycle or heterocycle.

Specific examples of the coupling components of the present invention represented by general formula (3) are shown below, but the present invention should not be construed as being limited thereto.

C-1

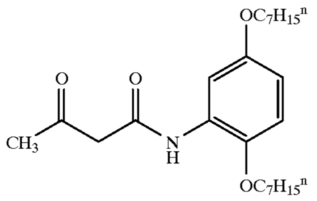

C-2

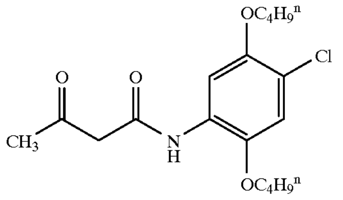

C-3

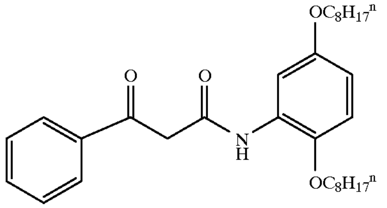

C-4

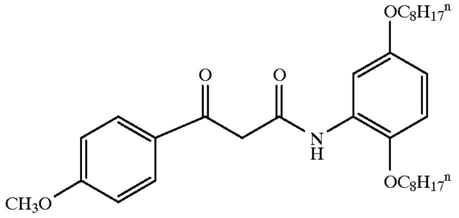

C-5

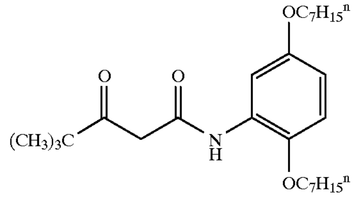

C-6

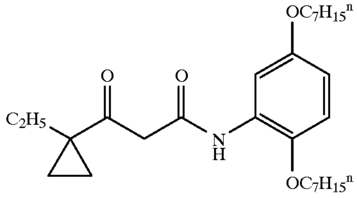

C-7

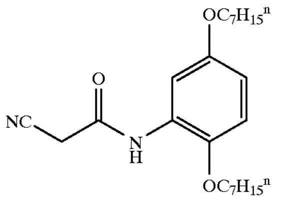

-continued
C-8
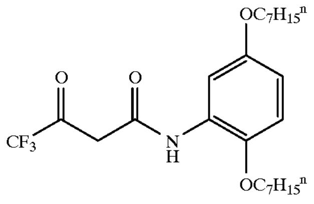
C-9
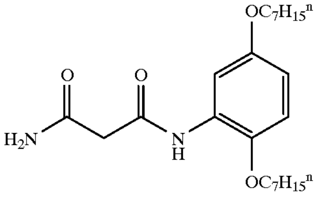
C-10
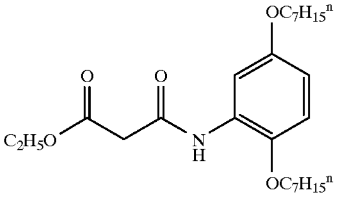
C-11
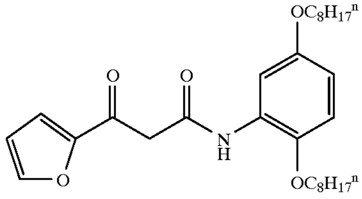
C-12
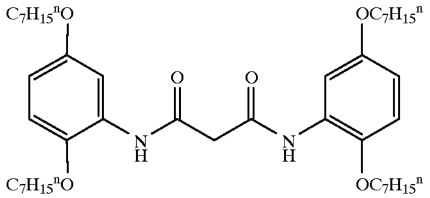
C-13
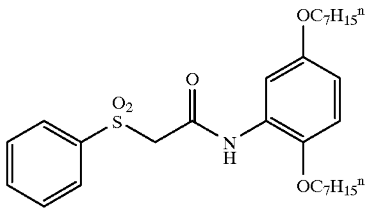
C-14
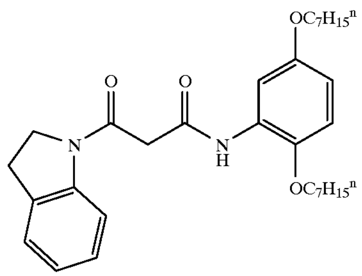
-continued
C-15
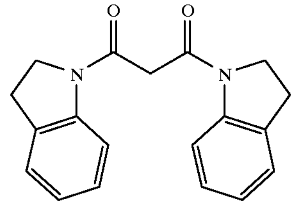
C-16
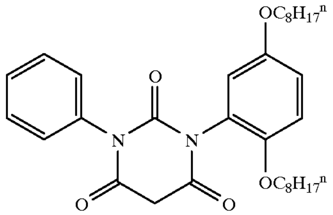
C-17
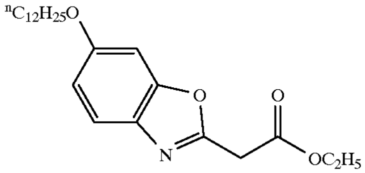
C-18
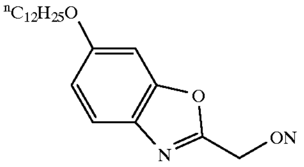
C-19
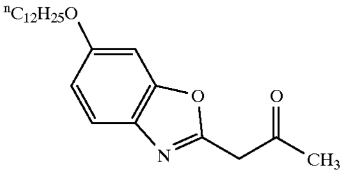
C-20
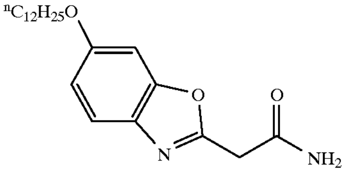
C-21
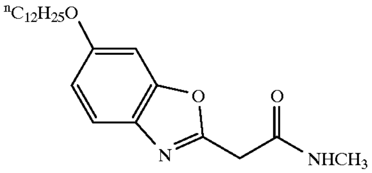
C-22
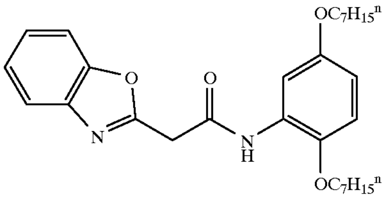

-continued

C-23

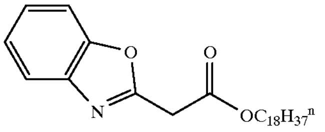

C-24

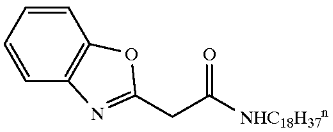

C-25

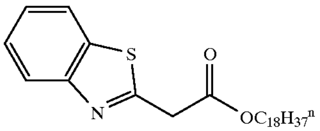

C-26

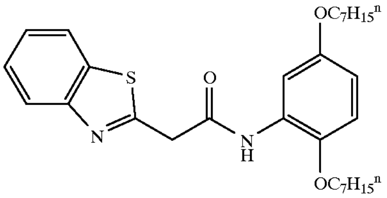

C-27

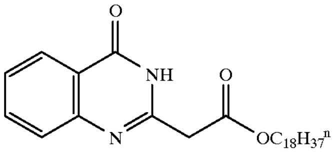

C-28

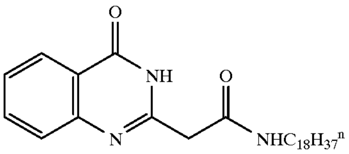

C-29

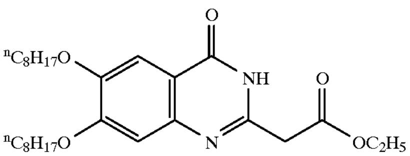

C-30

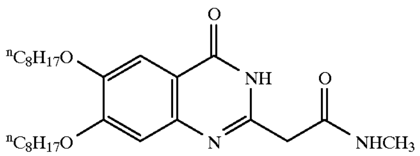

C-31

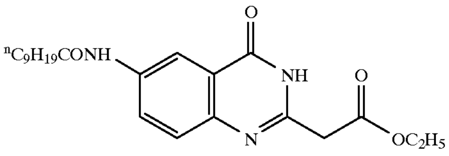

-continued

C-32

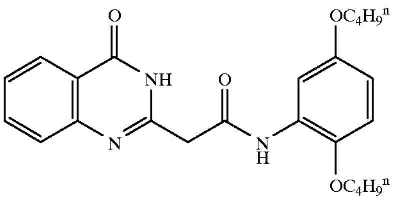

C-33

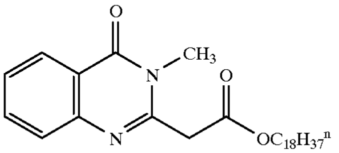

C-34

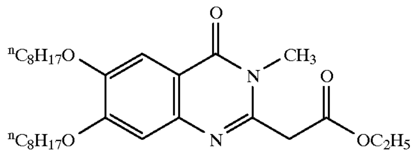

C-35

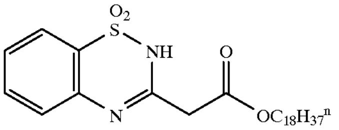

C-36

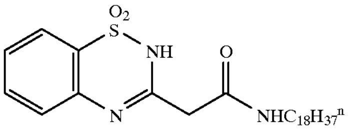

C-37

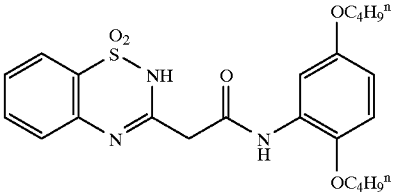

In the thermal recording material of the present invention, the diazo compound is preferably encapsulated in order to improve its raw stock storage stability before use. Microcapsules can be formed by methods well known in the art. The polymers used to form microcapsule walls should be nonpermeable at ordinary temperature and permeable when heated. In particular, polymers having a glass transition temperature ranging from 60 to 200° C. are preferred. Examples thereof include polyurethanes, polyureas, polyamides, polyesters, urea-formaldehyde resins, melamine resins, polystyrene, Adstyrene-methacrylate copolymers, styrene-acrylate copolymers and mixed systems thereof.

With regard to the method for forming microcapsules, interfacial polymerization and internal polymerization are suitable. Details of the capsule forming methods and specific examples of reactants are described in U.S. Pat. Nos. 3,726,804 and 3,796,669. For example, when a polyurea or a polyurethane is used as a material for the capsule walls, a polyisocyanate and a second substance which reacts therewith to form the capsule walls (for example, a polyol or a polyamine) are incorporated into an aqueous medium or an oily medium that is to be encapsulated. The components are emulsified and dispersed in water followed by heating, to thereby induce a polymer formation reaction in the oil droplet interface and form the capsule walls. When the addition of the above-noted second substance is omitted, a polyurea is also formed.

In the present invention, the polymer which is used to form the microcapsule walls is preferably at least one selected from polyurethanes and polyureas.

The method for producing diazonium salt-containing microcapsules (polyurea or polyurethane walls) for use in the present invention is described below.

First, a diazonium salt is dissolved in a hydrophobic organic solvent to form microcapsule cores. The organic solvent used in this case is preferably at least one selected from hydrocarbon halides, carboxylates, carboxylic acid amides, phosphates, carbonates, ketones, ethers, alkylated biphenyls, alkylated terphenyls and alkylated naphthalenes. A multifunctional isocyanate is further added as a wall material to the core solvent (oily phase).

On the other hand, for an aqueous phase, a water-soluble polymer such as polyvinyl alcohol or gelatin is dissolved in water to prepare an aqueous solution. Then, the above-described oily phase is poured thereinto, followed by emulsifying and dispersing with means such as a homogenizer. At this point of the reaction, the water-soluble polymer acts as a stabilizer for emulsification and dispersion. In order to more stably conduct emulsification and dispersion, a surfactant may be added to at least one of the oily phase and the aqueous phase.

The multifunctional isocyanate is used in an amount such that the microcapsules have a mean particle size of 0.3 μm to 12 μm and a wall thickness of 0.01 μm to 0.3 μm. The size of the dispersed particles is generally about 0.2 μm to about 10 μm. In the emulsified dispersion liquid, the polymerization reaction of the multifunctional isocyanate takes place at the interface of the oily phase and the aqueous phase to form polyurea walls.

If the polyol has previously been added to the aqueous phase, the multifunctional isocyanate reacts with the polyol to form the polyurethane walls. In order to enhance the reaction rate, the reaction temperature is preferably kept high or an appropriate polymerization catalyst is preferably added. The multifunctional isocyanates, the polyols, the reaction catalysts and polyamines for forming parts of the walls are described in detail by Keiji Iwata, *Polyurethane Handbook*, Nikkan Kogyo Shinbunsha (1987).

The hydrophobic organic solvent in which the above-noted diazonium salt compound is dissolved to form the microcapsule cores is preferably an organic solvent having a boiling point of 100 to 300° C. Specific examples thereof include alkylnaphthalenes, alkyldiphenylethanes, alkyldiphenylmethanes, alkylbiphenyls, chlorinated paraffin, tricresyl phosphate, maleates, adipates, sulfates and sulfonates. The solvents may be used as a mixture of two or more in combination.

When the solubility of the diazonium salt that is to be encapsulated in these solvents is poor, a low boiling solvent in which the diazonium salt is highly soluble can also be used in combination therewith. Specific examples thereof include ethyl acetate, butyl acetate, methylene chloride, tetrahydrofurane and acetone. When only a low boiling solvent is used for forming the cores of the microcapsules, the solvent evaporates during the microencapsulation reaction to form so-called coreless capsules in which the capsule walls and the diazo compound are integrally present.

The multifunctional isocyanate used as a raw material for the microcapsule walls is preferably a compound having a trifunctional or more functional isocyanate group. However, a difunctional isocyanate compound may be used in combination therewith. Specific examples thereof include multifunctional adducts of diisocyanates such as xylene diisocyanate and hydrogenated products thereof, hexamethylene diisocyanate, tolylene diisocyanate and hydrogenated products thereof, and isophorone diisocyanate, as main raw materials, with polyols such as trimethylolpropane, as well as dimers or trimers (burettes or isocyanurates) thereof, and condensates of benzene isocyanate with formalin.

Furthermore, the polyol or the polyamine, which is previously added to the hydrophobic solvent to form the cores or to the water-soluble polymer solution acting as a dispersing medium, can also be used as one of the raw materials for the microcapsule walls. Specific examples of the polyols and the polyamines include propylene glycol, glycerin, trimethylolpropane, triethanolamine, sorbitol and hexamethylenediamine. When the polyol is added, polyurethane walls are formed.

The water-soluble polymer for use in the water-soluble polymer solution thus prepared in which the oily phase of the capsules is dispersed is preferably a compound having a solubility in water of 5 wt % or more at the temperature at which the oily phase is to be emulsified. Specific examples thereof include polyvinyl alcohol and derivatives thereof, polyacrylic acid amide and derivatives thereof, ethylene-vinyl acetate copolymers, styrene-maleic anhydride copolymers, ethylene-maleic anhydride copolymers, isobutylene-maleic anhydride copolymers, polyvinylpyrrolidone, ethylene-acrylic acid copolymers, vinyl acetate-acrylic acid copolymers, carboxymethyl cellulose, methyl cellulose, casein, gelatin, starch derivatives, gum arabic and sodium alginate.

These water-soluble polymers preferably do not react with or have a low reactivity with the isocyanate compounds. For example, those having reactive amino groups in their molecular chains such as gelatin must be modified beforehand to decrease the reactivity.

Furthermore, when surfactants are added, the addition amount of the surfactant is preferably 0.1% to 5%, and particularly preferably 0.5% to 2%, based on the weight of oily phase.

The emulsification can be conducted using a known emulsifying device such as a homogenizer, a manton gaulin, an ultrasonic dispersing device, a dissolver or a Kady mill. After emulsification, the emulsified products are heated at a temperature of from 30 to 70° C. to enhance the capsule wall formation reaction. Furthermore, in order to prevent coagulation of the capsules, it is necessary to reduce the collision probability of the capsules by adding water, or by conducting sufficient stirring, during the reaction.

Dispersing agents for preventing coagulation may be newly added during the reaction. The generation of carbonic acid gas is observed with progress of the polymerization reaction, and the termination thereof is considered to be the approximate end of the capsule wall formation reaction. Usually, a reaction over a period of several hours can provide the desired diazonium salt-containing microcapsules.

In the thermal recording material of the present invention, an organic base may be added for enhancing the coupling reaction of the diazo compounds and the couplers. The organic base can be used alone or in a combination of two or more thereof. The basic materials include nitrogen-containing compounds such as tertiary amine compounds, piperidine compounds, piperazine compounds, amidine compounds, formamidine compounds, pyridine compounds, guanidine compounds and morpholine compounds. The compounds described in JP-B-52-46806 (the term “JP-B” as used herein means an “examined Japanese patent publication), JP-A-62-70082, JP-A-57-169745, JP-A-60-94381, JP-A-57-123086, JP-A-60-49991, JP-B-2-24916, JP-B-2-28479, JP-A-60-165288 and JP-A -57-185430 can be used.

Of these, particularly preferred are piperazine derivatives such as N,N'-bis(3-phenoxy-2-hydroxypropyl)-piperazine, N,N'-bis[3-(p-methylphenoxy)-2-hydroxypropyl]-piperazine, N,N'-bis[3-(p-methoxyphenoxy)-2-hydroxypropyl]-piperazine, N,N'-bis(3-phenylthio -2-hydroxypropyl)piperazine, N,N'-bis[3-(β-naphthoxy)-2-hydroxypropyl]piperazine, N-3-(β-naphthoxy) -2-hydroxypropyl-N'-methylpiperazine and 1,4-bis {[3-(N-methylpiperazino)-2-hydroxy]propyloxy}benzene; morpholine derivatives such as N-[3-(β-naphthoxy)-2-hydroxy]-propylmorpholine, 1,4-bis(3-morpholino-2-hydroxypropyloxy)-benzene and 1,3-bis(3-morpholino-2-hydroxypropyloxy)benzene; piperizine derivatives such as N-(3-phenoxy-2-hydroxypropyl)-piperizine and N-dodecylpiperizine; and guanidine derivatives such as triphenylguanidine, tricyclohexylguanidine and dicyclohexylphenylguanidine.

In the thermal recording material of the present invention, the coupling component and the organic base each is preferably used in an amount of from 0.1 to 30 parts by weight per one part by weight of the diazonium compound.

In the thermal recording material of the present invention, a color development auxiliary can be added for enhancing the color development above-description to the above-described organic base.

The color development auxiliary is a substance which increases the developed color density in thermal recording or lowers the minimum color development temperature, to thereby produce conditions under which the diazonium compound easily reacts with the coupling component. More particularly, the color development auxiliary lowers the melting point of the coupling component, the organic base, the diazonium salt or the like, or the softening point of the capsule walls.

The color development auxiliaries for use in the thermal recording material of the present invention include phenol derivatives, naphthol derivatives, alkoxy-substituted benzene derivatives, alkoxy-substituted naphthalene derivatives, aromatic ethers, thioethers, esters, amides, ureides, urethanes, sulfonamide compounds and hydroxy compounds. These compounds are added to the light-sensitive layers, for example, so as to conduct thermal print rapidly and safely at low energy.

The color development auxiliaries for use in the thermal recording material of the present invention also include thermally fusible substances. A thermally fusible substance is a substance having a melting point of 50 to 150° C. which is solid at ordinary temperature and melted by heating, and which dissolves the diazonium compound, the coupling component, the organic base or the like. Specific examples thereof include carboxylic acid amides, N-substituted carboxylic acid amides, ketone compounds, urea compounds and esters.

In the thermal recording material of the present invention, the following known antioxidants and the like are preferably used for improving the fastness of the thermally developed color images against light and heat, or for decreasing the yellow discoloration of unprinted areas after fixing due to the action of light.

The above-noted antioxidants are described, for example, in EP-A-223739, EP-A-309401, EP-A-309402, EP-A-310551, EP-A-310552, EP-A-459416, German Patent Publication (OLS) No. 3435443, JP-A-54-48535, JP-A-62-262047, JP-A-63-113536, JP-A-63-163351, JP-A-2-262654, JP-A-2-71262, JP-A-3-121449, JP-A-5-61166, JP-A-5-119449, and U.S. Pat. Nos. 4,814,262 and 4,980,275.

In the thermal recording material of the present invention, it is also effective to further add various known additives conventionally used in thermal recording materials and pressure sensitive recording martials. Specific examples of these antioxidants include the compounds described in JP-A -60-107384, JP-A-60-107383, JP-A-60-125470, JP-A-60-125471, JP-A-60-125472, JP-A-60-287485, JP-A-60-287486, JP-A-60-287487, JP-A-60-287488, JP-A-61-160287, JP-A-61-185483, JP-A-61-211079, JP-A-62-146678, JP-A-62-146680, JP-A-62-146679, JP-A-62-282885, JP-A-63-051174, JP-A-63-89877, JP-A-63-88380, JP-A-63-088381, JP-A-63-203372, JP-A-63-224989, JP-A-63-251282, JP-A-63-267594, JP-A-63-182484, JP-A-1-239282, JP-A-4-291685, JP-A-4-291684, JP-A-5-188687, JP-A-5-188686, JP-A-5-110490, JP-A-5-170361, JP-B-48-043294 and JP-B-48-033212.

Specifically, the antioxidants include 6-ethoxy-1-phenyl-2,2,4-trimethyl-1,2-dihydroquinoline, 6-ethoxy-1-octyl-2,2,4-trimethyl-1,2-dihydroquinoline, 6-ethoxy-1-phenyl-2,2,4-trimethyl-1,2,3,4-tetrahydroquinoline, 6-ethoxy-1-octyl-2,2,4-trimethyl-1,2,3,4-tetrahydroquinoline, nickel cyclohexanoate, 2,2-bis(4-hydroxyphenyl)propane, 1,1-bis (4-hydroxyphenyl) -2-ethylhexane, 2-methyl-4-methoxydiphenylamine and 1-methyl-2-phenylindole.

The addition amount of the antioxidant is preferably from 0.05 to 100 parts by weight, and more preferably from 0.2 to 30 parts by weight, per one part by weight of the diazonium compound.

The above-described known antioxidant can be incorporated into the microcapsules together with the diazonium compound, or can be used as a solid dispersion together with the coupling agent, the basic material and the other color development auxiliaries, or as an emulsion together with an appropriate emulsifying auxiliary, or in both of these forms. Also, the antioxidants may be used alone or in combination thereof. Furthermore, the antioxidant can also be added to a protective layer provided on the thermal recording layer.

These antioxidants are not necessarily added to the same layers. When used in combination, the antioxidants are classified into structural types such as aniline, alkoxybenzene, hindered phenol, hindered amine, hydroquinone derivative, phosphorus compound and sulfur compound types, and antioxidants of either different types or the same type can be used in combination.

The coupling component for use in the present invention, as well as the basic material and the other color development auxiliaries, can be solid dispersed in a sand mill or the like, together with a water-soluble polymer. However, these components are preferably dissolved in an organic solvent slightly soluble or insoluble in water, and then, mixed with an aqueous phase having a surfactant and/or a water-soluble polymer as a protective colloid to form a emulsified dispersion. From the viewpoint of easy emulsification and dispersion, a surfactant is preferably used.

The organic solvent used in this case can be appropriately selected, for example, from the high boiling oils described in JP-A-2-141279.

Of these, from the viewpoint of emulsion stability of the emulsified dispersion, the use of esters is preferred, and tricresyl phosphate is particularly preferred among others.

The above-described oils can be used in combination with each other, or with other oils.

It is also possible to further add an auxiliary solvent such as a low boiling dissolving auxiliary to the above-described organic solvent. Preferred examples of such auxiliary solvents include ethyl acetate, isopropyl acetate, butyl acetate and methylene chloride. In some cases, the low boiling auxiliary solvent can also be used alone without a high boiling oil.

The water-soluble polymers incorporated as a protective colloid in the aqueous phase to be mixed with the oily phase containing these components is appropriately selected from known anionic polymers, nonionic polymers and amphoteric polymers. Preferred examples of the water-soluble polymers include polyvinyl alcohol, gelatin and cellulose derivatives.

With regard to the surfactant incorporated into the aqueous phase, surfactants which do not develop precipitates or aggregation by action with the above-described protective colloids can be used, appropriately selecting from anionic or nonionic surfactants. Preferred examples of the surfactants include sodium alkylbenzenesulfonates, sodium alkylsulfates, the sodium salt of dioctyl sulfosuccinate, and polyalkylene glycols (for example, polyoxyethylene nonyl phenyl ether).

For reducing yellow discoloration of the ground areas after recording, free radical generators (compounds generating free radicals by light irradiation) used in photopolymerizable compositions or the like can be added to the thermal recording material of the present invention. The free radical generators include aromatic ketones, quinones, benzoin, benzoin ethers, azo compounds, organic disulfides and acyloxime esters. They are preferably added in an amount of from 0.01 to 5 parts by weight per one part by weight of the diazonium salt.

Similarly, for reducing yellow discoloration, polymerizable compounds having an ethylenic unsaturated bond (hereinafter referred to as vinyl monomers) can also be used. The term "vinyl monomer" means a compound having at least one ethylenic unsaturated bond (such as a vinyl group, a vinylidene group or the like) in its chemical structure and having a chemical form of a monomer or a prepolymer. Examples thereof include unsaturated carboxylic acids and salts thereof, esters of unsaturated carboxylic acids and polyhydric aliphatic alcohols, and amides of unsaturated carboxylic acids and multifunctional aliphatic amines. The vinyl monomer is preferably used in an amount of from 0.2 to 20 parts by weight per one part by weight of the diazonium salt.

The above-described free radical generators and vinyl monomers may be incorporated into the microcapsules together with the diazonium salt.

In the thermal recording material of the present invention, citric acid, tartaric acid, oxalic acid, boric acid, phosphoric acid, pyrophosphoric acid or the like can be added as acid stabilizers, in addition to the above-noted additives.

In the thermal recording material of the present invention, coating solutions containing the diazonium salt-containing microcapsules, the coupling component, the organic base and other additives are prepared, and supports made of paper or synthetic resin films are coated with the coating solutions by coating methods such as bar coating, blade coating, air knife coating, gravure coating, roll coating, spray coating, dip coating and curtain coating, followed by drying, to thus form one or more light-sensitive layers having a solid content of from 2.5 to 30 $g/m^2$.

In the thermal recording material of the present invention, the microcapsules, the coupling component, the base and the like may be contained either in the same layers or in different layers, respectively, of a lamination type recording material. Furthermore, an intermediate layer can also be provided on a support, followed by forming a light-sensitive layer thereon, as described in JP-A-61-54980.

Binders for use in the thermal recording material of the present invention include known water-soluble polymer compounds or latexes. The water-soluble polymer compounds include methyl cellulose, carboxymethyl cellulose, hydroxy-ethyl cellulose, hydroxypropyl cellulose, starch derivatives, casein, gum arabic, gelatin, ethylene-maleic anhydride copolymers, styrene-maleic anhydride copolymers, polyvinyl alcohol, epichlorohydrin-modified polyamides, isobutylene-maleinsalicylic anhydride copolymers, polyacrylic acid, polyacrylic acid amide and modified products thereof. The latexes include styrene-butadiene rubber latexes, methyl acrylate-butadiene rubber latexes and vinyl acetate emulsions.

Pigments for use in the thermal recording material of the present invention include known organic and inorganic pigments. Specific examples thereof include kaolin, calcined kaolin, talc, agalmatolite, diatomaceous earth, calcium carbonate, aluminum hydroxide, magnesium hydroxide, zinc oxide, lithopone, amorphous silica, colloidal silica, calcined gypsum, silica, magnesium carbonate, titanium oxide, alumina, barium carbonate, barium sulfate, mica, microballoon, urea-formalin fillers, polyester particles and cellulose fillers.

In the thermal recording material of the present invention, various additives such as known wax, antistatic agents, antifoaming agents, conducting agents, fluorescent dyes, surfactants, ultraviolet absorbers and precursors thereof can be used as needed.

In the thermal recording material of the present invention, a protective layer may be provided on the thermal recording layer(s) as needed. The protective layer may be laminated in two or more layers as needed. Materials for use in the protective layer include water-soluble polymer compounds such as polyvinyl alcohol, carboxy-modified polyvinyl alcohol, vinyl acetate-acrylamide copolymers, silicon-modified polyvinyl alcohol, starch, modified starch, methyl cellulose, carboxymethyl cellulose, hydroxymethyl cellulose, gelatin, gum arabic, casein, hydrolyzed products of styrene-maleic acid copolymers, hydrolyzed products of styrene-maleic acid copolymer half esters, hydrolyzed products of isobutylene-maleic anhydride copolymers, polyacrylamide derivatives, polyvinylpyrrolidone, polysodium styrenesulfonate and sodium alginate; and latexes such as styrene-butadiene rubber latexes, acrylonitrile-butadiene rubber latexes, methyl acrylate-butadiene rubber latexes and vinyl acetate emulsions. The water-soluble polymer compound of the protective layer can also be crosslinked to further improve its keeping stability, and known crosslinking agents can be used as the crosslinking agent. Specific examples thereof include water-soluble initial condensates such as N-methylolurea, N-methylolmelamine and urea-formalin; dialdehyde compounds such as glyoxal and glutaraldehyde; inorganic crosslinking agents such as boric acid and borax; and polyamidoepichlorohydrin. Furthermore, known pigments, metal soap, wax, surfactants and the like can also be added to the protective layer. The coating amount of the protective layer coated is preferably from 0.2 to 5 $g/m^2$, and more preferably from 0.5 to 2 $g/m^2$. The film thickness thereof is preferably from 0.2 to 5 $\mu m$, and particularly preferably from 0.5 to 2 $\mu m$.

When the thermal recording material of the present invention is provided with a protective layer, the protective layer may contain known ultraviolet absorbers or precursors thereof.

Supports for use in the thermal recording material of the present invention include any paper supports used in conventional pressure sensitive paper, thermal recording paper and dry or wet diazo copying paper. Specific examples thereof include acidic paper, neutral paper, coat paper, plastic film laminate paper in which paper is laminated with a plastic such as polyethylene, synthetic paper and a plastic film such as polyethylene terephthalate and polyethylene naphthalate films. In order to compensate for the curl balance of the support or to prevent the entrance of chemical agents from back face thereof, a back coat layer may be provided. The back coat layer can be formed in a manner similar to the above-described protective layer. It is furthermore possible to combine a separating paper on the back face by providing an adhesive layer to intervene therebetween, to take a label contitution.

In the thermal recording material of the present invention, a full-color thermal recording material can be obtained by further laminating thermal recording layers having developed hues which are different from each other. The additionally laminated thermal recording layers include those containing photolytic diazonium salts. When thermal recording layers having developed hues different from each other are laminated, intermediate layers can also be provided therebetween in order to prevent color mixing of the thermal recording layers. The intermediate layers may be composed of a water-soluble polymer compound such as gelatin, phthalated gelatin, polyvinyl alcohol and polyvinylpyrrolidone, and may appropriately contain various additives.

The present invention is described in detail below with reference to the following Examples, but the present invention should not be construed as being limited thereto. All parts and percentages are given by weight unless otherwise indicated.

EXAMPLE 1

Preparation of Diazonium Salt-Containing Microcapsule Solution A

To 19 parts of ethyl acetate, 2.8 parts. of diazonium salt (A-4) shown in Table 1 and 10 parts of tricresyl phosphate were added and homogeneously mixed therewith. Then, 7.6 parts of Takenate D110N (manufactured by Takeda Chemical Industries Co., Ltd.) were added as a wall material to the resulting mixed solution and mixed therewith to obtain solution I. Then, the above solution I was added to a mixed solution of 46 parts of an 8% aqueous solution of phthalated gelatin, 17.5 parts of water and 2 parts of a 10% aqueous solution of sodium dodecylbenzenesulfonate, followed by emulsifying and dispersing with a homogenizer at 40° C. at 10000 r.p.m. for 10 minutes. To the resulting emulsified product, 20 parts of water were added and homogenized. Thereafter, the encapsulation reaction was conducted with stirring at 40° C. for 3 hours to obtain diazonium salt-containing microcapsule solution A. The mean particle size of the microcapsules was 0.3 to 0.4 $\mu$m.

Preparation of Coupling Component Emulsion B

Three parts of coupling component (C-3), 4 parts of triphenylguanidine, 8 parts of 2-ethylhexyl 4-hydroxybenzoate, 4 parts of 1,1-bis(4-hydroxyphenyl)-2-ethylhexane, 8 parts of 4,4'-(m-phenylenediisopropylidene) diphenol, 0.48 part of tricresyl phosphate and 0.24 part of diethyl maleate were dissolved in 10.5 parts of ethyl acetate to obtain solution II.

Then, 49 parts of a 15% aqueous solution of lime-treated gelatin, 9.5 parts of a 10% aqueous solution of sodium dodecylbenzenesulfonate and 35 parts of water were homogeneously mixed at 40° C., and solution II was added thereto, followed by emulsifying and dispersing with a homogenizer at 40° C. at 10000 r.p.m. for 10 minutes. The resulting emulsified product was stirred at 40° C. for 2 hours to remove ethyl acetate, and thereafter, water was added thereto to obtain coupling component emulsion B.

Preparation of Coating Solution C for Thermal Recording Layer

Diazonium salt-containing microcapsule solution A (3.6 parts), 3.3 parts of water and 9.5 parts of coupling component emulsion B were mixed to obtain coating solution C for a thermal recording layer.

Preparation of Coating Solution D for Protective Layer

Thirty-two parts of a 10% aqueous solution of polyvinyl alcohol (polymerization degree: 1,700, saponification degree: 88%) and 36 parts of water were homogeneously mixed to obtain coating solution D for a protective layer.

Coating

A support for photographic printing paper comprising woodfree paper laminated with polyethylene was coated with solution C for a thermal recording layer and coating solution D for a protective layer in this order with a wire bar, followed by drying at 50° C. to obtain a desired thermal recording material. The coated amounts of the thermal recording layer and the protective layer coated were 8.4 $g/m^2$ and 1.2 $g/m^2$, respectively, as the solid contents.

Color Development Test

Using a thermal head (Type KST, manufactured by Kyocera Corp.), the applied electric power to the thermal head and the pulse width were adjusted so as to provide a recording energy per unit area of 50 $mJ/mm^{2,}$ and thermal printing was carried out on the thermal recording material to obtain an image. Then, the whole surface was irradiated with ultraviolet light for 10 seconds, using an ultraviolet lamp having an emission center wavelength of 420 nm and an output of 40 W. The developed color density and the ground density were measured at this time.

Light Fastness Test

The thermal recording material after recording was irradiated with light at 30000 luxes for 72 hours with a fluorescent lamp tester. Then, the densities of the color-developed area and the ground area were measured.

Raw Stock Storage Stability Test

The thermal recording material before recording was forcedly stored under conditions of 40° C. and 90% RH for 72 hours. After forced storage, the above-described color development test was carried out to measure the densities of the color-developed area and the ground area, respectively.

Photolytic Test

The whole surface of the thermal recording material before recording was irradiated with ultraviolet light for 10 seconds, using an ultraviolet lamp having an emission center wavelength of 420 nm and an output of 40 W. Thermal printing was carried out on this sample in the same manner as in the above-described color development test to obtain an image, and the developed color density and the ground density were measured at this time.

Density Measurement

For the density of the color-developed area and the ground area, measurements were conducted using a Macbeth RD 918 instrument with an optical filter for determining an yellow density (a transmission or reflection density of a blue light) equipped with the instrument.

EXAMPLE 2

A thermal recording material was prepared and evaluated in the same manner as in Example 1, except that C-7 was used as the coupling component.

EXAMPLE 3

A thermal recording material was prepared and evaluated in the same manner as in Example 1, except that C-29 was used as the coupling component.

EXAMPLE 4

A thermal recording material was prepared and evaluated in the same manner as in Example 1, except that A-4 was used as the diazonium salt.

EXAMPLE 5

A thermal recording material was prepared and evaluated in the same manner as in Example 1, except that A-15 was used as the diazonium salt.

EXAMPLE 6

A thermal recording material was prepared and evaluated in the same manner as in Example 5, except that C-29 was used as the coupling component.

Comparative Example 1

A thermal recording material was prepared and evaluated in the same manner as in Example 1, except that diazonium salt B-1 shown below and coupling component C-1 were used.

Comparative Example 2

A thermal recording material was prepared and evaluated in the same manner as in Example 1, except that diazonium salt B-1 shown below was used.

B-1

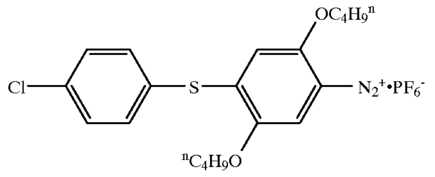

The results obtained are shown in the Tables below.

TABLE 2

| | Diazonium Salt | Coupling Component | Developed Color Density before Photolytic Test | Developed Color Density after Photolytic Test |
|---|---|---|---|---|
| Example 1 | A-3 | C-3 | 1.38 | 1.38 |
| Example 2 | A-3 | C-7 | 1.35 | 1.35 |
| Example 3 | A-3 | C-29 | 1.27 | 1.27 |
| Example 4 | A-4 | C-3 | 1.35 | 1.35 |
| Example 5 | A-15 | C-3 | 1.41 | 1.36 |
| Example 6 | A-15 | C-29 | 1.36 | 1.32 |
| Comparative Example 1 | B-1 | C-1 | 1.10 | 0.08 |
| Comparative Example 2 | B-1 | C-3 | 0.92 | 0.08 |

The thermal recording materials of the present invention provides fast color-developed images having an extremely high developed color density. Furthermore, the thermal recording material of the present invention has excellent stock storage stability before use.

While the invention has been described in detail and with reference to specific examples thereof, it will be apparent to one skilled in the art that various changes and modifications can be made therein without departing from the spirit and scope thereof.

What is claimed is:

1. A thermal recording material comprising a support having thereon a thermal recording layer comprising a diazonium salt, microcapsules and a coupling component, said diazonium salt being encapsulated in said microcapsules, wherein said diazonium salt is a compound represented by the following general formula (1):

TABLE 1

| | Diazonium Salt | Coupling Component | Developed Color Density | Density of Color-Developed Area after Light Fastness Test | Density of Color-Developed Area after Raw Stock Storage Stability Test | Density of Ground Area | Density of Ground Area after Light Fastness Test | Density of Ground Area after Raw Stock Storage Stability Test |
|---|---|---|---|---|---|---|---|---|
| Example 1 | A-3 | C-3 | 1.38 | 1.21 | 1.24 | 0.07 | 0.10 | 0.09 |
| Example 2 | A-3 | C-7 | 1.35 | 1.22 | 1.24 | 0.08 | 0.14 | 0.12 |
| Example 3 | A-3 | C-29 | 1.27 | 1.08 | 1.23 | 0.07 | 0.12 | 0.10 |
| Example 4 | A-4 | C-3 | 1.35 | 1.20 | 1.22 | 0.07 | 0.09 | 0.08 |
| Example 5 | A-15 | C-3 | 1.41 | 1.15 | 1.35 | 0.07 | 0.11 | 0.10 |
| Example 6 | A-15 | C-29 | 1.36 | 1.10 | 1.30 | 0.09 | 0.09 | 0.10 |
| Comparative Example 1 | B-1 | C-1 | 1.10 | 0.66 | 0.78 | 0.08 | 0.14 | 0.09 |
| Comparative Example 2 | B-1 | C-3 | 0.92 | 0.64 | 0.66 | 0.08 | 0.13 | 0.09 |

General Formula (1)

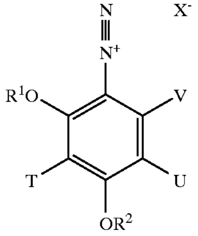

wherein T and U each independently represents a hydrogen atom, a halogen atom, an alkyl group or an acylamino group; V represents a hydrogen atom, a halogen atom, an alkyl group or $OR^3$; $R^1$, $R^2$ and $R^3$ each independently represents an alkyl group or an aryl group; and $X^-$ represents an anion.

2. The thermal recording material as claimed in claim 1, wherein said diazonium salt is a compound represented by the following general formula (2):

General Formula (2)

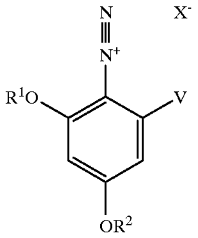

wherein V represents a hydrogen atom, a halogen atom, an alkyl group or $OR^3$; $R^1$, $R^2$ and $R^3$ each independently represents an alkyl group or an aryl group; and $X^-$ represents an anion.

3. The thermal recording material as claimed in claim 1, wherein said coupling component is a compound represented by the following general formula (3):

General Formula (3)

$$E^1—CH_2—E^2$$

wherein $E^1$ and $E^2$ each independently represents an electron-withdrawing group.

4. The thermal recording material as claimed in claim 1, wherein said thermal recording layer further comprises an organic base arranged outside said microcapsules.

5. The thermal recording material as claimed in claim 1, wherein said coupling component is arranged outside said microcapsules.

6. The thermal recording material as claimed in claim 1, wherein said thermal recording layer contains said diazonium salt in an amount of from 0.01 to 5 $g/m^2$.

7. The thermal recording material as claimed in claim 1, wherein said thermal recording layer contains said coupling component in an amount of from 0.1 to 30 parts by weight per one part by weight of the diazonium salt.

8. The thermal recording material as claimed in claim 4, wherein said thermal recording layer contains said organic base in an amount of from 0.1 to 30 parts by weight per one part by weight of the diazonium salt.

9. The thermal recording material as claimed in claim 1, wherein said thermal recording layer further contains a binder.

* * * * *